United States Patent [19]
Broadbent et al.

[11] Patent Number: 5,445,525
[45] Date of Patent: Aug. 29, 1995

[54] INTERCONNECTION SCHEME FOR INTEGRATED CIRCUIT CARD WITH AUXILIARY CONTACTS

[75] Inventors: Neal E. Broadbent, El Dorado Hills; Duncan D. MacGregor, Shingle Springs, both of Calif.

[73] Assignee: Intel Corporation, Santa Clara, Calif.

[21] Appl. No.: 241,722

[22] Filed: May 12, 1994

[51] Int. Cl.⁶ .............................................. H05K 7/10
[52] U.S. Cl. ...................................... 439/64; 361/686
[58] Field of Search .................. 439/76, 676, 377, 64; 361/760, 736, 737, 686, 785

[56] References Cited

U.S. PATENT DOCUMENTS

| | | | |
|---|---|---|---|
| 5,183,404 | 2/1993 | Aldous et al. | 439/131 |
| 5,184,282 | 2/1993 | Kaneda et al. | 361/737 |
| 5,313,364 | 5/1994 | Omori et al. | 361/737 |

OTHER PUBLICATIONS

No author, *PCMCIA, Personal Computer Memory Card International Association PC Card Standard, Release 2.0*, 3-13 through 3-26 (Sep. 1991).

No author, *PCMCIA Recommended Extensions, Release 1.00*, 1-3 through 1-8 (1992).

*Primary Examiner*—Neil Abrams
*Attorney, Agent, or Firm*—Blakely, Sokoloff, Taylor & Zafman

[57] ABSTRACT

A method and apparatus for providing alternate signal paths between a removably insertable integrated circuit (IC) card in a computer system and an external device is described. The method and apparatus includes an IC card designed for coupling with the external device through a rear I/O receptacle located along the rear IC card edge, the IC card also including an auxiliary side contacts along a side edge. The method and apparatus includes the use of a flexible conducting strip to connect each of the auxiliary side contacts along the side edge to the appropriate pins of the rear I/O receptacle. In this manner the IC card contains alternate signal paths to the external device, being capable of coupling to the external device in either a rear-connecting scheme or a side-connecting scheme, the adaptation to side contacts having been achieved with minimal redesign of the rear-connecting IC card.

6 Claims, 5 Drawing Sheets

INTERCONNECTION SCHEME FOR INTEGRATED CIRCUIT CARD WITH AUXILIARY CONTACTS

CROSS-REFERENCE TO RELATED APPLICATIONS

The following co-pending U.S. patent applications relate to the present application. Each of the listed co-pending applications are assigned to the same assignee as the present application.

1) U.S. patent application Ser. No. 08/009,135, Filed Jan. 26, 1993, and titled, "METHOD AND APPARATUS FOR PROPAGATING SIGNALS ON INTEGRATED CIRCUIT CARDS"

2) U.S. patent application Ser. No. 08/249,290, Filed May 26, 1994, and titled, "MODULAR COMMUNICATIONS CONNECTOR FOR I/O CARD APPLICATIONS"

3) U.S. patent application Ser. No. 08/243,228, Filed May 13, 1994and titled, "INTEGRAL EXTERNAL CONNECTOR INTERFACE FOR THE FORM FACTOR COMPUTER CARDS"

4) U.S. patent application Ser. No. 08/234,481, Filed April 28, 1994, and titled, "KEYING NOTCHES FOR SIDE CONTACTS ON A THIN FORM FACTOR COMPUTER CARD"

FIELD OF THE INVENTION

The present invention relates to the field of removably insertable integrated circuit (IC) cards for use in computer systems. Specifically, the present invention relates to IC cards containing auxiliary input/output contacts in addition to their standard computer interfaces.

BACKGROUND OF THE INVENTION

Portable computers have recently become more powerful while at the same time becoming lighter and smaller. Peripheral devices are often used in conjunction with the portable computer to provide increased functionality, such as communications ability or enhanced data storage. One example of a peripheral device is a modem, which allows a user of a portable computer to communicate with other computers using telephone lines. Reduction in the size of peripheral devices has accompanied reductions in the size of portable computers.

Some portable computer systems and peripheral devices, modems in particular, have been designed recently such that the peripheral device is contained on a thin form factor computer card which plugs into a socket recessed within the body of the computer. Such peripheral devices can be carried along with the portable computer and inserted when needed.

Historically, each of the peripheral devices (e.g. modems, memory devices, facsimile, LANs, etc.) has required its own interface circuitry for connecting to the internal circuitry of a portable computer. This interface circuitry required a separate socket for each device, and thus more space in the portable computer. For example, a modem card and a memory card each required a separate socket, and thus two sockets were necessary even though only one was in use at a given time.

Recently, devices have been devised which allow some of these various forms of computer components to be plugged into the same socket of the computer, thereby reducing space required within the portable computer. For example, an international standard which defines the physical and electrical interface specifications for the interchangeability of memory and input/output cards was introduced by the Personal Computer Memory Card International Association (PCMCIA) jointly with the Japanese Electrical Industry Association (JEIDA) in September of 1991. In addition, a specification referred to as an Exchangeable Card Architecture (ExCA) specification, dated Dec. 20, 1991, has been issued by Intel Corporation of Santa Clara, Calif. The ExCA document describes specifications which manufacturers may use to provide interfaces which are ensured of allowing the memory and input/output cards for portable personal computers of different manufacturers to be interchanged.

A socket designed to these specifications allows cards, such as modem and flash memories, to be inserted, used, and removed interchangeably in the same socket. The computer systems used typically contained at least one socket recessed within the computer, such that the inserted computer card containing the modem, flash memory, etc., is protected by the body of the computer surrounding the socket in which the components are coupled.

The PCMCIA specification provides that the personal computer cards have a 68-pin connector located at the end of the card for transmitting signals between the computer and the card. Many system manufacturers desire to connect to critical signals on the integrated circuit card which are not available through the 68-pin connector. One example of such a need is found when the computer card is a modem card, in which case tip-ring connections between an external RJ11 jack and the modem card are needed. Such connections have typically been achieved through a second connector located along the rear edge of the computer card, i.e. the edge which faces to the outside of the computer which the card is inserted. This rear edge is opposite the 68-pin standard interface.

In the above example a two pin (tip and ring) connection is needed. In other applications a different number of pins may be needed in the second connector. The PCMCIA architecture includes a standard 15-pin interface along the rear edge of the PCMCIA card for coupling to external signals. Thus, in the above example, the modem card could include the 15-pin interface along its rear edge, using two of the pins to carry the tip-ring signals. In use, a 15-pin male attachment, coupled to the external RJ11 jack, is attached to the 15-pin connector on the inserted modem card. In the computer industry, PCMCIA cards designed with standard rear connectors such as the PCMCIA 15-pin standard connector, including modem cards, have been designed and developed at significant embedded cost. Other rear connectors, such as 14-pin connectors on Intel PCMCIA computer card products, have been used as well.

Another method of transferring external signals to a computer card, which can replace or be additive to the rear connectors, is described in a co-pending application, Ser. No.08/099,135, "Method and Apparatus for Propagating Signals on Integrated Circuit Cards", applicant David C. Scheer, filed Jan. 26, 1993, and assigned to the assignee of the present invention. The "sideswipe" invention disclosed in the above pending application can provide tip-ring connections to a modem card, for example, through embedded contacts in the side of the computer card receptacle. One advantage of such a configuration is the elimination of the need to directly attach an external connector to the rear of the inserted modem card.

One problem which exists is that an integrated circuit card designed with rear external connectors may be desired for use in a side-contacting configuration as well, and it is thus desired to be able to adapt an integrated circuit card which has been designed with rear connections to a configuration which enables the card to receive signals through the side contacts as well.

Another problem which exists is the significant cost which can accompany a redesign of the existing integrated board circuitry, which is contained within the integrated circuit card, when the location of input signal contacts is changed.

Another problem which exists is that of unwanted electromagnetic radiation interference which can arise if conductor runs on the integrated circuit board carrying the input signals are lengthened to accommodate the change in the location of the input signal contacts, absent a substantial redesign of the existing integrated circuit board circuitry.

SUMMARY OF THE INVENTION

It is an object of the present invention to enable a removably insertable integrated circuit (IC) card, which has been designed for receiving an external input at a first I/O receptacle location along a first edge in a first input connection scheme, to be adapted for being capable of receiving substantially the same external signal input at an auxiliary I/O receptacle which is at a different location than the first I/O receptacle in a second input connection scheme.

It is another object of the present invention to enable such an adaptation in a way which reduces the redesign costs of an integrated circuit board of the removably insertable integrated circuit card.

It is yet another object of the present invention to provide for such an adaptation in a way which avoids extraneous electromagnetic signals which can result from a lengthening of input signal conductor runs of the integrated circuit board of the removably insertable integrated circuit card.

These and other objects of the invention are provided for by a removably insertable integrated circuit (IC) card for use in a computer system, the IC card comprising an integrated circuit board for processing signals including a first set of signals, the first set of signals being provided from an external device, the integrated circuit board including external I/O contacts for providing a path for the first set of signals to the integrated circuit board; a frame for holding the IC board, the frame including a first I/O receptacle located along a first frame edge for providing a signal path for the first set of signals between the external device and the external I/O contacts of the integrated circuit board, the frame including an auxiliary I/O receptacle located along a second frame edge for providing an alternate signal path for at least one of the first set of signals between the external device and the integrated circuit board; and a flexible conducting strip, the flexible strip being coupled to the auxiliary I/O receptacle and the first I/O receptacle, for transferring signals between the auxiliary I/O receptacle and the first I/O receptacle, such that the alternate signal path is achieved, and such that signals from the external device may be transferred to the integrated circuit board through the first I/O receptacle, through the auxiliary I/O receptacle, or through both the first and auxiliary I/O receptacles.

DETAILED DESCRIPTION OF THE PRESENT INVENTION

A method and apparatus for achieving an adaptation of a removably insertable integrated (IC) circuit card which has been designed for receiving external inputs at a first I/O receptacle location along a first edge in a first input connection scheme, to an IC card which is capable of receiving substantially the same external input at an auxiliary I/O receptacle which is at a different location than the first I/O receptacle in a second input connection scheme, is described. In the following description, numerous details are set forth such as specific types of I/O receptacles, specific numbers of pins and electrical contacts, sizes of receptacles, types of computer card applications, etc., in order to provide a thorough understanding of the present invention. It will be apparent, however, to one skilled in the art that the present invention may be practiced without these specific details. In other instances, well-known structures and devices are shown in block diagram form, rather than in detail, in order to avoid unnecessarily obscuring the present invention.

The present invention is advantageously employed in computer system design optimized for applications with lower power consumption and compact size. Such applications typically include small battery-powered personal computers of the type commonly referred to as laptops and notebooks. One such computer system is briefly described below; however, it is to be understood that the present invention is not limited to this particular computer system design and may be incorporated into virtually any processor-based system design.

Figure 1:
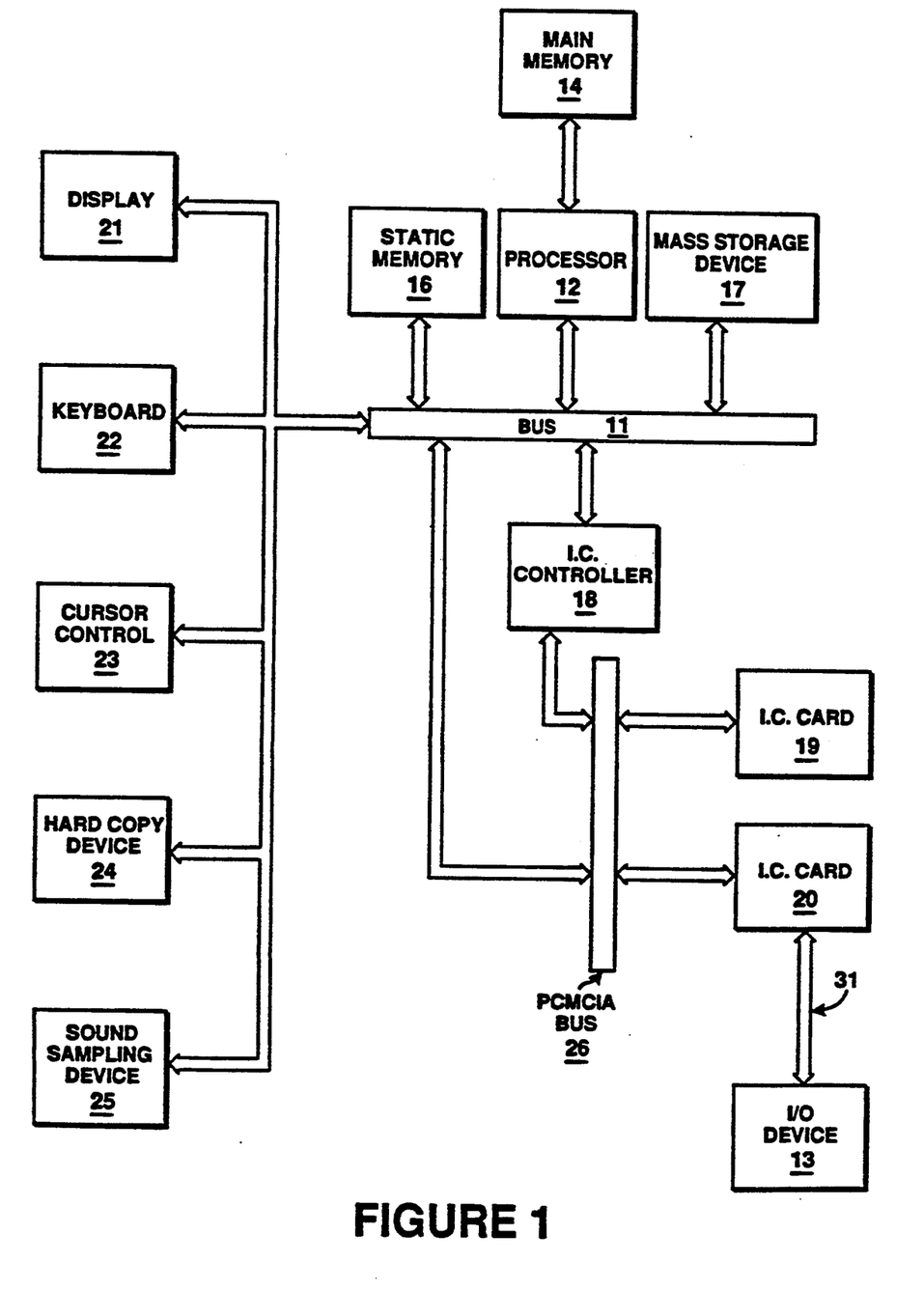
FIG. 1 illustrates a block diagram of a computer system designed for use with removably insertable integrated circuit cards.

FIG. 1 shows a block diagram of a computer system in which the present invention is advantageously employed. The computer system as may be utilized with the preferred embodiment of the present invention generally comprises a bus for communication means 11 for communicating information, processing means 12 coupled with bus 11 for processing information, a random access memory (RAM) or other dynamic storage device 14 coupled with processing means 12 for storing information and instructions for processing means 12, a read only memory (ROM) or other non-volatile storage device 16 coupled with bus 11 for storing non-volatile information and instructions for processing means 12, a data storage device 17, such as a magnetic disk or disk drive, coupled with bus 11 for storing information and instructions, a display device 21, such as a cathode ray tube, liquid crystal display, etc., coupled to bus 11 for displaying information to the computer user, an alpha-numeric input device 22 including alpha-numeric and other keys, etc., coupled to bus 11 for communicating information and command selections to processor 12, and a cursor control 23 coupled to bus 11 for controlling cursor movement. The computer system also includes a hard copy device 24, such as a plotter of printer, for providing visual representation of the computer images. Hard copy device 24 is coupled with processor 12, main memory 14, non-volatile storage device 16 and mass storage device 17 through bus 11. The computer system also includes a sound recording and playback device 25 coupled to bus 11 for providing audio recording and playback.

Integrated circuit cards 19 and 20 are included in the computer system and are coupled to PCMCIA bus 26. Note that although the computer system only shows two IC cards, the number of IC cards which may be coupled to the computer system may vary. In the currently preferred embodiment, IC cards 19 and 20 are PCMCIA cards. PCMCIA bus 26 is coupled to bus 11 and to integrated circuit (IC) controller 18 for providing communication information between cards 19 and 20 and the remainder of the computer system. In the currently preferred embodiment, PCMCIA bus 26 is a standard PCMCIA bus for communicating information according to the PCMCIA standard. Note that although IC cards 19 and 20 and PCMCIA bus 26 of the present invention communicate according to the PCMCIA standard, other interface types and configurations fall within the scope of the present invention. IC controller 18 provides control and address information to IC cards 19 and 20 via PCMCIA bus 26 and is coupled to bus 11. Also note that although the cards are shown coupled to PCMCIA bus 26, in the currently preferred embodiment the cards are not coupled to PCMCIA bus 26 until they are inserted into slots in the side of the computer, such that their standard main interface (e.g., the 68 pin PCMCIA standard interface) is mated with the interface pins (e.g., the 68 pins) within the computer system.

The computer system also includes a signal path or bus 31 (i.e., sideswipe contact bus) for communicating information to IC card 20 by other than its standard interface. In one embodiment, signal path/bus 31 may only transfer one signal, while in other embodiments, bus 31 provides the signal path for multiple signals. Note that IC card 19 may be coupled to a sideswipe contact bus.

Finally, the computer system includes input/output (I/O) device 13 for providing an input/output port or connector for the computer system. I/O device 13 is coupled to signal path/bus 31 for access to signals from IC card 20. In another implementation, I/O device 13 could also be coupled to bus 11 for communication with the remainder of the computer system. In one implementation, I/O device 13 comprises a jack or plug, such as an RJ11 jack, RJ45 jack or other proprietary or telephone port that is coupled to the PC chassis for input and output. In such a case the signal path/bus 31 represents tip-ring (T/R) telephone line paths. I/O device 13 can also include an infra-red antennae or a radio-frequency antennae or other communications device. Note that although only one I/O device is shown, the computer system may include multiple I/O devices, and multiple I/O devices may be coupled to a single IC card. The present invention relates to the electrical and mechanical means by which I/O device 13 is coupled to the IC card 20.

Of course certain implementations and uses of the present invention may not require that the computer system include all of the above components. For example in certain implementations a keyboard and cursor control device for inputting information to the system may not be required. In other implementations, it may not be required to provide a display device for displaying information. Also, some components may be coupled in other configurations. For instance, main memory 14 may be coupled directly to bus 11 instead of being coupled to processor 12 directly.

It is further emphasized that the following description of the present invention does not limit the possible applications of the IC cards 19 and 20. In the following descriptions a modem application is described. However, the invention is not so limited to a modem application, but can include any IC card functionality which requires coupling to external electrical signals which are not provided through the standard primary interface of the IC card (the 68-pin interface in a PCMCIA application). For example, the external electrical signals may be those associated with the IC card being a wireless communication device (e.g. antenna signals).

Figure 2:
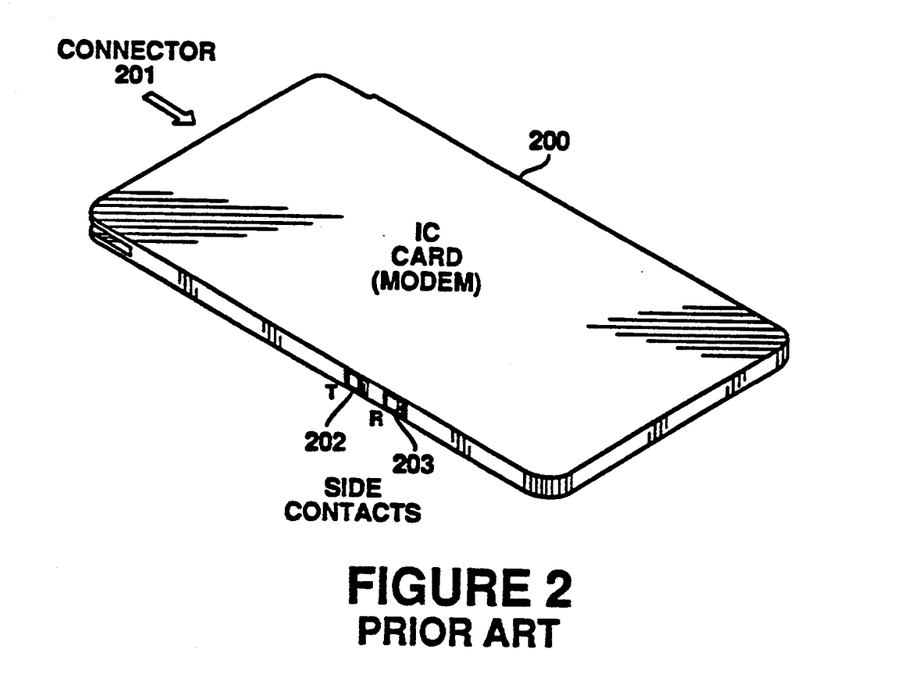
FIG. 2 illustrates a PCMCIA computer card which incorporates side contacts.

FIG. 2 shows a PCMCIA computer card which incorporates sideswipe contacts. The PCMCIA card of FIG. 2 is a modem card 200. Such a modem card 200 would be incorporated in the system of FIG. 1 as IC card 20. Modem card 200 includes a standard PCMCIA 68-pin interface connector 201 at its front edge. The modem card 200 also includes side contacts 202 and 203, which are for transmitting tip and ring signals, respectively, between the modem card 200 and corresponding side contacts in an IC card receptacle of a computer system which has been outfitted for use with side contact technology.

Figure 3:
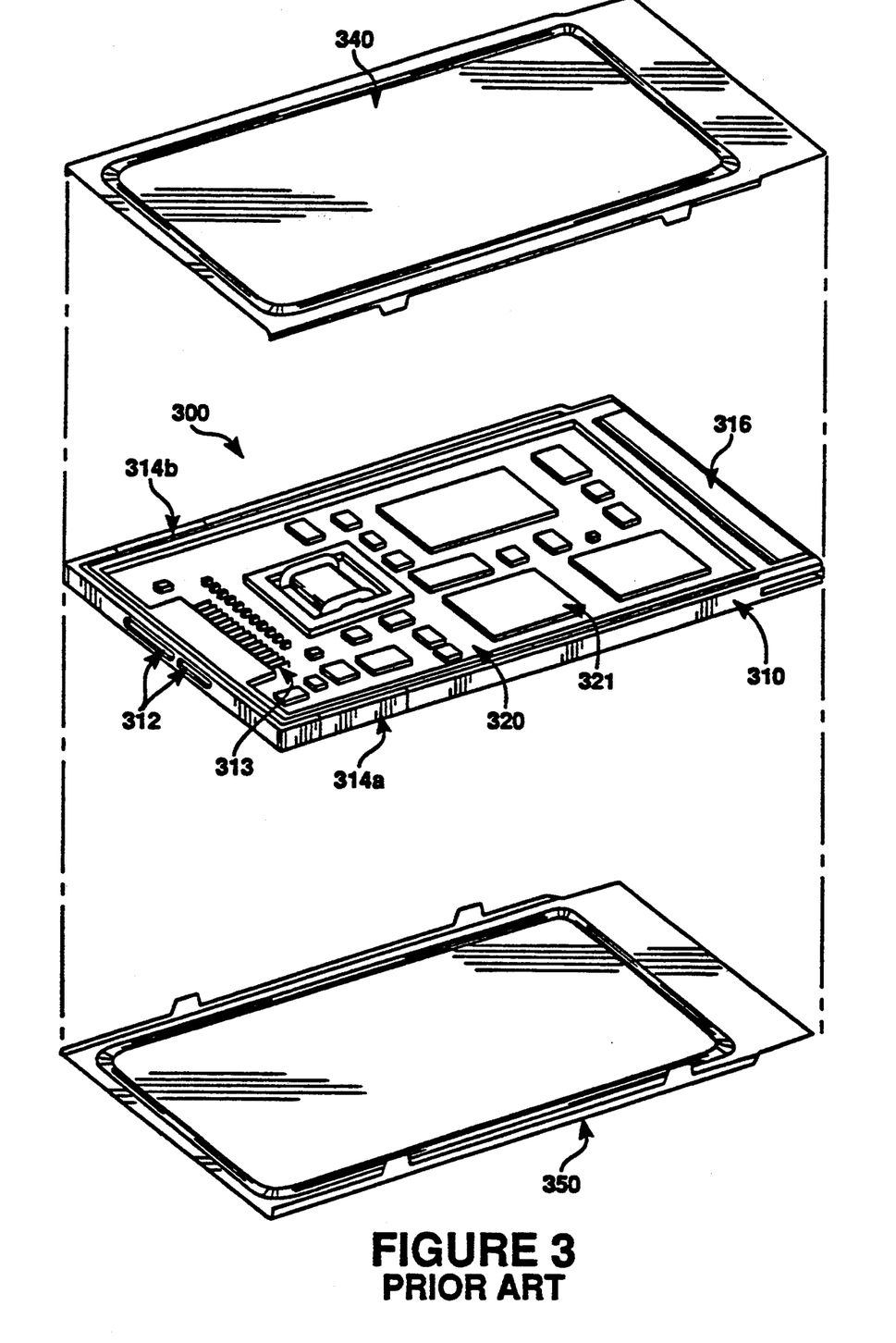
FIG. 3 illustrates a PCMCIA computer card which incorporates a 14-pin rear connector.

FIG. 3 shows an exploded view of a PCMCIA computer card which incorporates a 14-pin rear connector. The PCMCIA card of FIG. 3 is a modem card 300, which includes an IC card frame 310, a 14-pin rear connector 312, rear connector pins 313, grounding pins 314a and 314b, a standard PCMCIA 68-pin interface connector 316, a circuit board 320 including modem circuitry 321, a top cover 340, and a bottom cover 350. As shown in FIG. 3, the 14-pin rear connector 312 is contained along a rear edge of the modem card 300, and is coupled to a corresponding adapter when in use. The corresponding adapter, not shown in FIG. 3, carries the tip and ring signals to two of the connector pins 313, which are coupled to the modem circuitry 321. The modem circuitry 321 is coupled to the PCMCIA bus 26 of FIG. 1 via 68-pin connector 316 when the modem card 300 is inserted and in use.

It has been found that the design of the PCMCIA modem card 300 can be modified in accordance with the present invention, such that a PCMCIA modem card can be produced for use in either a rear contact scheme or a side contact scheme, in a way such that virtually no changes in the design layout of the circuit board 320 are needed, and such that only minor design additions to the IC card frame 310 are needed. Additionally, it has been found that such modifications made in accordance with the present invention also produce a desired effect in that electromagnetic signal interference increases normally attributed to such design adaptations are reduced.

Figure 4:
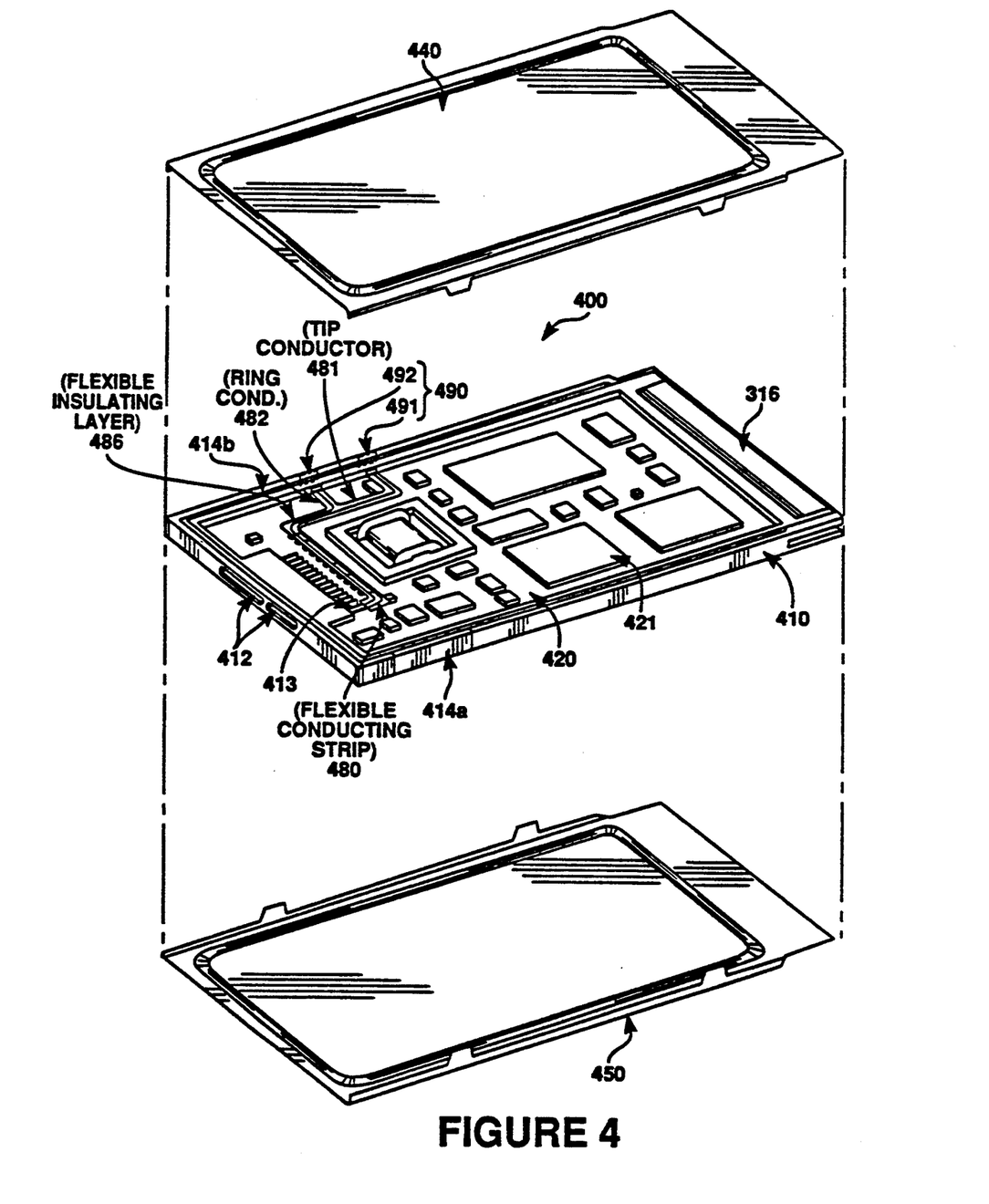
FIG. 4 illustrates an IC card containing both side contacts and a 14-pin rear connector in accordance with a first embodiment of the present invention.

FIG. 4 illustrates a PCMCIA modem IC card made in accordance with a first embodiment of the present invention. FIG. 4 shows a PCMCIA card which is a modem IC card 400, the modem card 400 being capable of use in a rear connector scheme (as is the PCMCIA modem card 300 shown in FIG. 3) or in a side connection scheme (as is the PCMCIA modem card 200 shown in FIG. 2). The PCMCIA modem card 400 includes an IC card frame 410, a 14-pin rear connector 412, rear connector pins 413, grounding pins 414a and 414b, a standard PCMCIA 68-pin interface connector 416, a circuit board 420 including modem circuitry 421, a top cover 440, a bottom cover 450, a flexible conducting strip 480, and an auxiliary I/O receptacle 490 which includes conducting contacts 491 and 492.

The modem IC card 400, in accordance with an object of the present invention, is capable of being used in either a rear-connection scheme or a side-connection scheme. The PCMCIA modem card 400 of FIG. 4 represents a design modification of the modem card 300 of FIG. 3. As shown in FIG. 4, the auxiliary I/O receptacle 490 is included in the IC card frame 410. In the presently described embodiment of the invention the auxiliary I/O receptacle 490 comprises two conducting contacts formed a small distance apart along a side edge of the IC card frame 410 for contacting side IC card receptacle contacts. The conducting contacts 491 and 492 each appear at an outer edge of IC card frame 410 for contact with computer IC card receptacle contacts, and at an inner edge of IC card frame 410 for coupling to the flexible conducting strip 480. The flexible conducting strip 480 is raised above the plane of the circuit board 420 and runs from the location of the conducting contacts 491 and 492 to the location of the connecting pins 413. In one embodiment the flexible conducting strip 480 is mechanically supported by the solder connections to the conducting contacts 491 and 492 at a first end, and by solder connections to the connecting pins at a second end.

In a first connection scheme, the PCMCIA modem card 400 of FIG. 4 is used in substantially the same manner as the modem card 300 of FIG. 3, that is, with a corresponding rear adapter which provides the desired tip and ring signals. In a second connection scheme, however, the PCMCIA modem card 400 can be provided with the desired tip and ring signals in substantially the same manner as the modem card 200 of FIG. 2, that is, through the conducting contacts 491 and 492 of the auxiliary I/O receptacle 490 from an IC card receptacle adapted for side contact technology. In such a scheme the flexible conducting strip 480 acts as an alternate signal path, transferring the tip and ring signals to the same place on circuit board 420 (i.e. the appropriate rear connector pins 413) as if the PCMCIA modem card were configured in first connection scheme. Thus, one reason that the modem IC card 400 made in accordance with the present invention represents an advance is that it is capable of use in more than one external interconnection scheme. In either connection scheme the tip and ring signals are coupled to the appropriate pads of circuit board 420. The modem circuitry 421 of circuit board 420 is coupled to the PCMCIA bus 26 of FIG. 1 via 68-pin connector 416 when the modem card 400 is inserted and in use.

The initial steps of production of the PCMCIA modem card 400 are substantially the same as the initial production steps of the modem card 300, which are known in the art. The circuit board 420 including modem circuitry 421 is typically produced separately from the IC card frame 410, using well-known methods. The circuit board 420 is then typically attached to PCMCIA standard 68-pin interface connector 416. The IC card frame 410 is typically produced separately and then attached to the circuit board 420, also using methods known in the art. The attachment process includes the soldering of connector pins 413 to appropriate corresponding pads on circuit board 420.

In an implementation according to the present invention, however, the IC card frame 410 is produced in a way which includes the auxiliary I/O receptacle 490 with conducting contacts 491 and 492 appearing on an outer and inner edge of IC card frame 410. Frame 410 includes a flexible conducting strip 480, which electrically couples conducting contacts 491 and 492 to the connecting pins 413. It is noted that the flexible conducting strip 480 may be coupled to the appropriate pads of the circuit board 420 to which the connecting pins 413 lead, and does not necessarily need to be coupled to the connecting pins 413 themselves.

The flexible conducting strip 480 is comprised of materials which allow propagation of one or more electrical signals. In the present embodiment of the invention, the flexible conducting strip 480 comprises flexible conductors 481 and 482 for carrying the tip and ring signals, and a flexible insulating layer 486. Note that in FIG. 4 the flexible conductors 481 and 482 are visible through the flexible insulating layer 486 in which they are embedded, but in general the flexible conductors 481 and 482 may or may not be so visible. The flexible conducting strip has a substantially flat shape in order to enable its location as above the plane of the circuit board 420 while not requiring additional thickness in the overall shape of the modem card 300, upon which the design of the modem card 400 is based. It is noted that the flexible conducting strip 480 is known in the art by terms including "flex-on-board" technology. A final step in the production process includes the attachment of top and bottom covers 440 and 450 to provide strength and ease of handling.

It is noted that the method and apparatus of the present invention has several advantages. First, there are no required design changes to the circuit board 320 to produce the circuit board 420, which represents a substantial cost savings as compared to conventional redesign and adaptation techniques which typically involve circuit board redesign.

A second advantage is that the location of the flexible conducting strip can be inexpensively adjusted so as to reduce electromagnetic interference with sensitive components of the circuit board 420. The PCMCIA modem IC card 400 is not limited to being a modem card, the scope of the invention including many types of computer cards which may include, for example, wireless communications adapters for computers. It is likely to be important in I/O receptacle adaptations of computer cards of this nature to avoid close proximity between an incoming antenna signal path and certain components of the wireless communications adapter. The flexible conducting strip may be laterally routed between FO receptacles 490 and 412 in a way to achieve this result. One such lateral route lies, for example, along a perimeter path of the circuit board 420 defined by the frame edges containing the FO receptacle 412 and the auxiliary FO receptacle 490 in order to achieve maximal distance from a substantial portion of the circuit board 420 circuitry, but the invention is not so limited.

Figure 5:
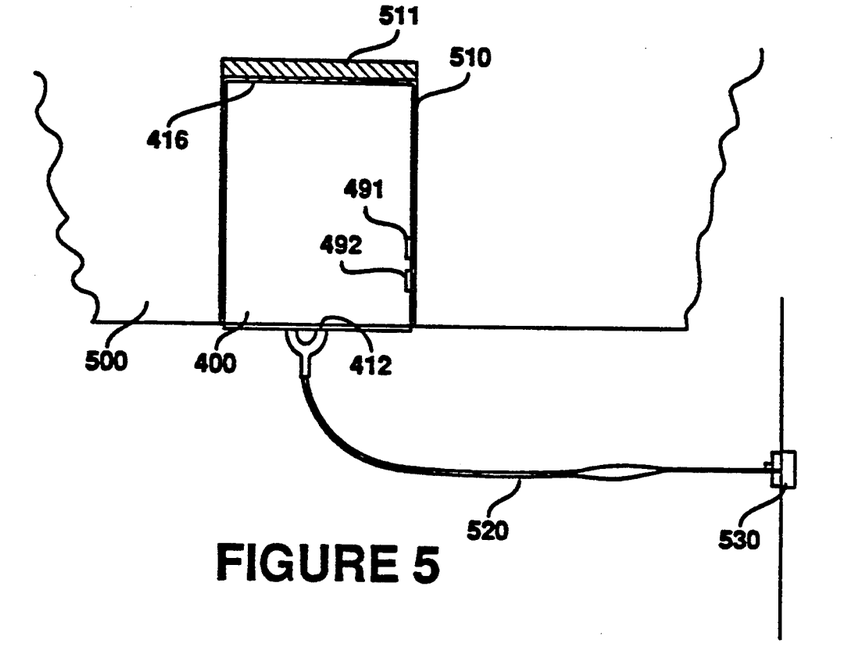
FIG. 5 illustrates an IC card made in accordance with the present invention as used in a computer system not equipped to accept side-contacting IC cards.

FIG. 5 illustrates the PCMCIA modem card 400 as inserted into a portable computer system 500 which is not equipped for a side contact regime. Portable computer 500 includes an IC card receptacle 510 for receiving the body of the PCMCIA modem IC card 400, the IC card receptacle 510 including a standard PCMCIA 68-pin interface 511 for connecting to the standard PCMCIA 68-pin connector 416 of the PCMCIA modem IC card 400, the standard PCMCIA 68-pin interface 511 being coupled to a bus corresponding to PCMCIA bus 26 of FIG. 1. In such a case, an adapter 520 is attached to the rear 14-pin connector 412 and carries tip and ring signals from an RJ11 jack 530.

Figure 6:
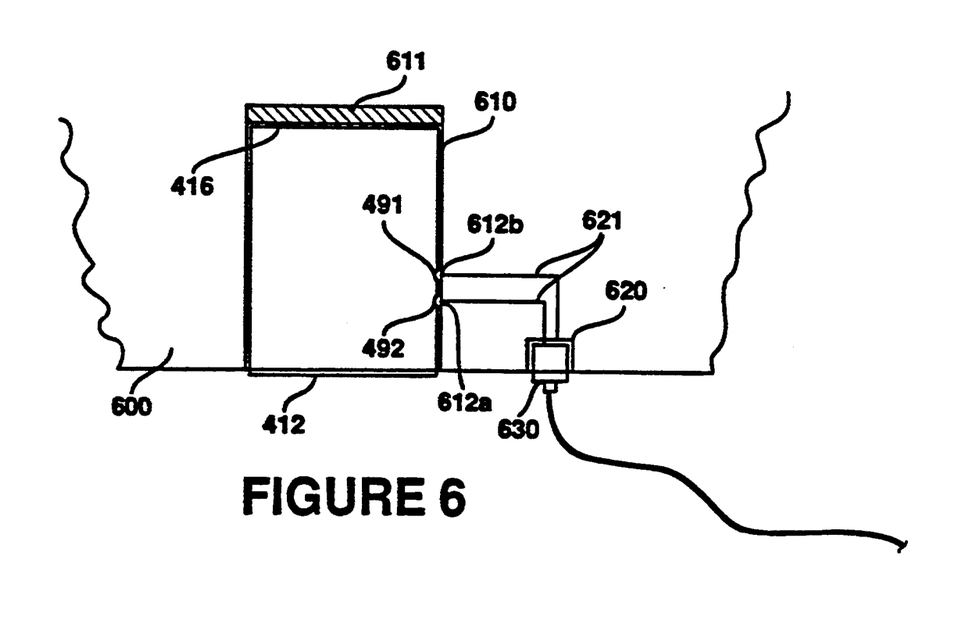
FIG. 6 illustrates an IC card made in accordance with the present invention as used in a computer system equipped to accept side-contacting IC cards.

FIG. 6 illustrates the PCMCIA modem card 400 as inserted into a portable computer system 600 which has been equipped with a side contact scheme. Portable computer 600 includes an IC card receptacle 610 for receiving the body of the PCMCIA modem card 400, the IC card receptacle 610 including a standard PCMCIA 68-pin interface 611 for connecting to the standard PCMCIA 68-pin connector 416 of the PCMCIA modem card 400, the standard PCMCIA 68-pin interface 611 being coupled to a bus corresponding to PCMCIA bus 26 of FIG. 1. IC card receptacle 610 also includes side contacts 612*a* and 612*b* for coupling to the conducting contacts 492 and 491 of the PCMCIA modem card 400. Portable computer 600 also includes a female RJ11 jack 620 for receiving tip and ring connections from a standard RJ11 plug 630. Finally, portable computer 600 includes leads 621 for coupling the jack 620 to the side contacts 612*a* and 612*b*. It is noted that even in the portable computer 600 which contains side contacts, the PCMCIA modem card 400 is capable of being operated using the rear contact regime of FIG. 5 as well.

In the above description of the invention, an embodiment is described using a single flexible conducting strip containing two conductors to connect two auxiliary connections to the existing I/O receptacle contacts. The scope of the invention, however, is not limited to the case of a single flexible strip nor to the case of two auxiliary connections. In another embodiment of the invention, for example, there may be an IC card which uses 4 external signals, such as those of an RJ45 4-wire connection. In such a case there are 4 side contacts, and the flexible conducting strip contains 4 conductors. In yet another embodiment there are two flexible conducting strips, each containing two conductors, which connect the side contacts to the existing I/O receptacle.

Thus, a method and apparatus for achieving an adaptation of a removably insertable integrated computer circuit (IC) card which has been designed for receiving external inputs at a first I/O receptacle location along a first edge in a first input connection scheme, to an IC card capable of receiving substantially the same external inputs at an auxiliary I/O receptacle which is at a different location than the first I/O receptacle in a second input connection scheme, has been described. Whereas many alterations and applications of the present invention will no doubt become apparent to a person of ordinary skill in the art after reading the foregoing description, it is understood that the particular embodiments shown and described by illustration are in no way intended to be limiting. Therefore, references to details of the preferred embodiments are not intended to limit the scope of the claims which themselves recite only those features regarded as essential to the invention.

What is claimed is:

1. A removably insertable integrated circuit (IC) card for use in a computer system, comprising:
    an integrated circuit (IC) board, said IC board comprising an external I/O interface for transferring a first set of signals between said IC board and an external device;
    a frame for holding said IC board, said frame comprising: a first I/O receptacle located along a first frame edge for providing a signal path for said first set of signals between said external device and said external I/O interface of said circuit board; and
    an auxiliary I/O receptacle located along a second frame edge for providing an alternate signal path for at least one of said first set of signals between said IC board and said external device; and
    a flexible conducting strip coupled to said auxiliary I/O receptacle and said first I/O receptacle such that said alternate signal path is formed and passes through said flexible conducting strip and through said auxiliary I/O receptacle.

2. The removably insertable IC card of claim 1, wherein at least a portion of said flexible conducting strip is located in a plane separate from the plane of the IC board.

3. The removably insertable IC card of claim 1, wherein at least a portion of said flexible conducting strip is placed along a perimeter path defined by said first frame edge and said second frame edge.

4. The removably insertable IC card of claim 2, wherein the removably insertable IC card is a PCMCIA standard card for use in portable computer systems.

5. A method for providing alternate signal paths between a personal computer integrated circuit (IC) card and an external device, comprising the steps of:
    placing at least one primary contact along a first frame edge of said IC card for transferring a first signal between said IC card and said external device;
    placing an auxiliary contact along a second frame edge of said IC card for providing an alternate signal path for said first signal between said IC card and said external device; and
    placing on said IC card a flexible conducting strip coupled to said primary contact and said auxiliary contact such that said alternate signal path is formed and passes through said flexible conducting strip.

6. A frame apparatus for holding the body of a removably insertable integrated circuit (IC) card for use in a computer system, said frame apparatus comprising:
    a first receptacle placed along a first frame edge for electrical coupling to an external I/O interface of said IC card for transferring a first set of signals between said IC card and an external device;
    a second receptacle placed along a second frame edge; and
    a flexible conducting strip coupled to said first receptacle and to said second receptacle;
    wherein
    signals on the IC card are capable of being transferred to an external device along a path which includes said flexible conducting strip.

* * * * *

UNITED STATES PATENT AND TRADEMARK OFFICE
CERTIFICATE OF CORRECTION

PATENT NO. : 5,445,525
DATED : August 29, 1995
INVENTOR(S) : Broadbent et al.

It is certified that error appears in the above-indentified patent and that said Letters Patent is hereby corrected as shown below:

In column 1 at line 22 delete "THE" and insert --THIN--

In column 8 at line 64 delete "FO" and insert --I/O--

In column 8 at line 67 delete "FO" and insert --I/O--

In column 8 at line 68 delete "FO" and insert --I/O--

Signed and Sealed this

Twenty-ninth Day of October 1996

Attest:

BRUCE LEHMAN

*Attesting Officer*            *Commissioner of Patents and Trademarks*